US008840701B2

(12) United States Patent
Borland et al.

(10) Patent No.: US 8,840,701 B2
(45) Date of Patent: Sep. 23, 2014

(54) MULTI-ELEMENT METAL POWDERS FOR SILICON SOLAR CELLS

(75) Inventors: William J. Borland, Chapel Hill, NC (US); Howard David Glicksman, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 661 days.

(21) Appl. No.: 12/539,677

(22) Filed: Aug. 12, 2009

(65) Prior Publication Data

US 2010/0037951 A1 Feb. 18, 2010

Related U.S. Application Data

(60) Provisional application No. 61/088,497, filed on Aug. 13, 2008, provisional application No. 61/088,777, filed on Aug. 14, 2008.

(51) Int. Cl.
| | |
|---|---|
| B22F 9/00 | (2006.01) |
| B22F 9/22 | (2006.01) |
| H01B 1/22 | (2006.01) |
| H01L 31/18 | (2006.01) |
| B22F 9/24 | (2006.01) |
| H01L 31/0224 | (2006.01) |
| B22F 1/00 | (2006.01) |
| B22F 9/28 | (2006.01) |

(52) U.S. Cl.
CPC .. *B22F 9/24* (2013.01); *H01B 1/22* (2013.01); *B22F 2998/10* (2013.01); *B22F 2999/00* (2013.01); *H01L 31/18* (2013.01); *Y02E 10/52* (2013.01); *H01L 31/022425* (2013.01); *B22F 1/0048* (2013.01); *B22F 9/28* (2013.01)
USPC ............... 75/367; 75/351; 75/363; 252/518.1

(58) Field of Classification Search
USPC ......................... 75/351, 363, 367; 252/518.1
See application file for complete search history.

(56) References Cited

U.S. PATENT DOCUMENTS

| | | | |
|---|---|---|---|
| 3,381,182 | A | 4/1968 | Thornton |
| 3,968,272 | A | 7/1976 | Anand |
| 4,105,471 | A | 8/1978 | Yerkes et al. |
| 4,153,907 | A | 5/1979 | Kofron |
| 4,278,704 | A | 7/1981 | Williams |
| 4,394,673 | A | 7/1983 | Thompson et al. |
| 4,486,232 | A | 12/1984 | Nakatani et al. |
| 4,643,913 | A | 2/1987 | Okunaka et al. |
| 4,737,197 | A | 4/1988 | Nagahara et al. |
| 5,118,362 | A | 6/1992 | St. Angelo et al. |
| 5,405,466 | A | 4/1995 | Naito et al. |
| 5,429,657 | A * | 7/1995 | Glicksman et al. ............. 75/351 |
| 5,698,451 | A | 12/1997 | Hanoka |
| 5,928,405 | A | 7/1999 | Ranade et al. |
| 6,679,938 | B1 * | 1/2004 | Kim et al. .................. 75/365 |
| 2004/0231758 | A1 * | 11/2004 | Hampden-Smith et al. .. 148/537 |
| 2006/0231801 | A1 | 10/2006 | Carroll et al. |
| 2007/0137692 | A1 | 6/2007 | Carlson |
| 2007/0148336 | A1 | 6/2007 | Bachrach et al. |
| 2009/0101190 | A1 | 4/2009 | Salami et al. |
| 2009/0159121 | A1 | 6/2009 | Yang et al. |
| 2010/0037939 | A1 | 2/2010 | Eickelmann et al. |
| 2010/0037941 | A1 | 2/2010 | Borland et al. |
| 2010/0037942 | A1 | 2/2010 | Borland et al. |
| 2010/0071754 | A1 | 3/2010 | Chang et al. |
| 2010/0163101 | A1 | 7/2010 | Kumar et al. |

FOREIGN PATENT DOCUMENTS

| | | |
|---|---|---|
| EP | 0591882 A1 | 4/1994 |
| EP | 0662521 A2 | 7/1995 |
| EP | 1386708 A2 | 2/2004 |
| FR | 2549290 A1 | 1/1985 |
| JP | 2004207493 A | 7/2004 |
| WO | 8907343 A1 | 8/1989 |
| WO | 2008134417 A1 | 11/2008 |
| WO | 2009009512 A1 | 1/2009 |
| WO | 2009048983 A2 | 4/2009 |
| WO | 2010019532 A2 | 2/2010 |

OTHER PUBLICATIONS

Andrews et al., "Barrier Heights to n-Silicon", Journal of Vacuum Science and Technology, 1974, vol. 11, Issue 6, pp. 972-984.
International Search Report for International Application No. PCT/US2009/053562 Dated Jan. 15, 2010.
Hansen, Max, Constitution of Binary Alloys, Second Edition, 1958, pp. 504-505, 1040-1041, McGraw-Hill Book Company.
Lee, S. H., Cost Effective Process for high-efficiency solar cells, Nanotechnology Materials and Devices Conference, IEEE, Oct. 22, 2006, pp. 526-528, Piscataway, NJ.
Saito, T. et al., Solar energy absorber mfd. From composite layer containing metal matrix and particles of metal, boride, carbide, nitride, silicide, oxide, graphite, or carbon, WPI/Thomson, Jul. 22, 1982, Matsushita Electric Works, Ltd.
Kim, Joondong et al., Metal silicide-mediated microcrystalline silicon thin-film growth for photovoltaics, Solar Energy Materials & Solar Cells, 2007, pp. 534-538, vol. 91, Elsevier, B.V.
Richardson, F. D. et al., The Thermodynamics of Substances of Interest in Iron and Steel Making from 0 degrees C to 2400 degrees C, Journal of the Iron and Steel Institute, Nov. 1948, pp. 261-270.
Bahr, M. et al., A New Approach for the Front Side Metallization of Industrial Type Silicon Solar Cells Using Structurization by Etching, Presented at the 22nd European Photovoltaic Solar Energy Conference, Sep. 3-9, 2007, Milan, Italy.
U.S. Appl. No. 12/536,227, filed Aug. 5, 2009.
U.S. Appl. No. 12/536,238, filed Aug. 5, 2009.
U.S. Appl. No. 12/617,929, filed Nov. 13, 2009.

* cited by examiner

*Primary Examiner* — Mark Kopec
*Assistant Examiner* — Haidung Nguyen (57) ABSTRACT

Disclosed are methods of making multi-element, finely divided, metal powders containing one or more reactive metals and one or more non-reactive metals. Reactive metals include metals or mixtures thereof from titanium (Ti), zirconium (Zr), hafnium (Hf), tantalum (Ta), niobium (Nb), vanadium (V), nickel (Ni), cobalt (Co), molybdenum (Mo), manganese (Mn), and iron (Fe). Non-reactive metals include metals or mixtures such as silver (Ag), tin (Sn), bismuth (Bi), lead (Pb), antimony (Sb), zinc (Zn), germanium (Ge), phosphorus (P), gold (Au), cadmium (Cd), berrylium (Be), tellurium (Te).

10 Claims, 4 Drawing Sheets

MULTI-ELEMENT METAL POWDERS FOR SILICON SOLAR CELLS

FIELD OF THE INVENTION

This invention is directed to making multi-element, finely divided, spherical, metal powders containing one or more reactive metals and one or more non-reactive metals. In particular, the invention is directed to a process for making multi-element, finely divided, metal powders containing at least one reactive metal and at least one non-reactive metal and the use of these powders in silicon solar cells.

TECHNICAL BACKGROUND OF THE INVENTION

Conventional terrestrial solar cells are generally made of thin wafers of silicon (Si) in which a rectifying or p-n junction has been created and electrode contacts, that are electrically conductive, have been subsequently formed on both sides of the wafer. A solar cell structure with a p-type silicon base has a positive electrode contact on the base or backside and a negative electrode contact on the n-type silicon or emitter that is the front-side or sun-illuminated side of the cell. The "emitter" is a layer of silicon that is doped in order to create the rectifying or p-n junction and is thin in comparison to the p-type silicon base. It is well-known that radiation of an appropriate wavelength incident on a p-n junction of a semiconductor body serves as a source of external energy to generate hole-electron pairs in that body. Because of the potential difference which exists at a p-n junction, holes and electrons move across the junction in opposite directions. The electrons move to the negative electrode contact, and the holes move to positive electrode contact, thereby giving rise to the flow of an electric current that is capable of delivering power to an external circuit. The electrode contacts to the solar cell are important to the performance of the cell. A high resistance silicon/electrode contact interface will impede the transfer of current from the cell to the external electrodes and therefore, reduce efficiency.

Process flow in mass production of electric power-generating solar cells is generally aimed at achieving maximum simplification and minimizing manufacturing costs. Electrode contacts in particular, are generally made by screen printing a paste containing metal and a glass frit.

A silver paste for the front electrode is screen printed then dried over the silicon nitride film. In addition, backside silver or silver/aluminum paste and an aluminum paste are then screen printed and successively dried on the backside of the substrate. Co-firing of front and backside pastes is then carried out in an infrared furnace at a temperature range of approximately 700° C. to 975° C. in air for a period of from several minutes to several tens of minutes.

During the co-firing, the front electrode-forming silver paste sinters and penetrates through the silicon nitride film during firing and is thereby able to electrically contact the n-type layer. This type of process is generally called "fire through" or "etching" of the silicon nitride Conventional front electrode silver pastes contain silver powder, an organic binder, a solvent, a glass frit and may contain various additives. The silver powder functions as the main electrode contact material and provides for low resistance. The glass frit may contain lead or other low melting point constituents to give a softening point of about 300 to 600° C. so that during firing, it becomes molten and functions as the "fire through" agent wherein the silicon nitride is penetrated to allow the silver to make contact to the n-type silicon. The glass frit also provides for adhesion of the sintered silver to the silicon. Additives may be used as additional dopants to modify the n-type conductivity.

There is an on-going effort to improve efficiency of industrial silicon solar cells. One key focus is the reduction of contact resistance of the front face electrode contact. It is generally accepted that the contact formation of conventional screen printed silver pastes to the front face of solar cells involves a complex series of interactions between the glass, silver, silicon nitride and silicon. The sequence and rates of reactions occurring during the firing process are factors in forming the contact between the silver paste and the silicon. The interface structure after firing consists of multiple phases: substrate silicon, silver-silicon islands, silver precipitates within the insulating glass layer, and bulk sintered silver. As a result, the contact mechanism is a mix of direct ohmic contact by the silver-silicon island and silver precipitates and tunneling through thin layers of the glass. The extent of each of these components of the structure depends on many factors such as the glass composition, the amount of glass in the composition and the temperature of firing. Compositions and firing profiles of the silver paste are optimized to maximize cell efficiency. However, the presence of glass at the metal-silicon interface inevitably results in a higher contact resistance than would be realized by a pure metal contact to silicon.

The issues of forming good contacts to bipolar silicon devices are well known. All metal semiconductor contacts have a potential barrier that makes the contact rectifying. The lower the barrier height, the better the contact to silicon. There are several variables that control the barrier height, including the work function of the metal, the crystalline or amorphous nature of the silicon-metal interface, and the extent to which the interface is associated with charge carrier traps that pin the semiconductor Fermi energy. For example, using the Shottky limiting case for predicting band line up, for n-type silicon, if the work function for the metal is greater than the work function of the silicon, the contact between the two is rectifying. However, if the work function for the metal is lower than that of the silicon, the contact is ohmic. A metal cannot have low or zero barrier height on both n-type and p-type semiconductors. A metal that has a low barrier height on n-type silicon will have a high barrier height on p-type silicon and vice versa. Thus electrical contacts to silicon are optimized for the type of silicon. Low Shottky barrier height silicide contacts to n-type silicon semiconductor devices are well known. U.S. Pat. Nos. 3,381,182, 3,968,272 and 4,394,673, for example, disclose various suicides that form low Shottky barrier height contacts to bipolar silicon devices when the metal is placed in contact with the silicon and heated. However, such an approach has not been previously feasible with silicon solar cells due to the silicon nitride anti-reflective coating being a barrier to the reaction of the metal with the silicon.

The present inventors have created a novel process for making multi-element metal powders to be used to form front electrode contacts to silicon solar cells that eliminate the presence of a glass interface, which provides superior contact resistance and maintains adhesion.

SUMMARY OF THE INVENTION

The present invention is directed to a material that is a multi-element, finely divided, spherical, metal powder containing one or more reactive metals and one or more non-reactive metals. As used herein, reactive metals include metals or mixtures thereof that will react with silicon nitride to form low Shottky barrier height contacts to the underlying silicon. The reaction with silicon nitride may form nitrides and suicides or only suicides depending on the metal. Metals that react with silicon nitride to form conductive nitrides and suicides include titanium (Ti), zirconium (Zr), hafnium (Hf), tantalum (Ta), niobium (Nb) and vanadium (V) and the reaction is represented by the following equation using titanium as an example:

$$Si_3N_4 + 7Ti \rightarrow 4TiN + 3TiSi$$

Metals that react with silicon nitride to form conductive metal suicides include nickel (Ni), cobalt (Co), molybdenum (Mo), manganese (Mn), and iron (Fe) and the reaction is represented by the following equation using nickel as the example:

$$3Ni + Si_3N_4 \rightarrow 3NiSi + 2N_{2(gas)}$$

The invention is further directed to a method for the manufacture of a multi-element, finely divided, spherical, metal powder containing one or more reactive metals and one or more non-reactive metals containing elements comprising:
a. forming a solution of a mixture of thermally decomposable reactive metal containing compounds and non-reactive metal containing compounds in a thermally volatilizable solvent;
b. forming an aerosol consisting essentially of finely divided droplets of the solution from step A dispersed in a carrier gas, the droplet concentration which is below the concentration where collisions and subsequent coalescence of the droplets results in a 10% reduction in droplet concentration;
c. heating the aerosol to an operating temperature above the decomposition temperature of the reactive metal containing compounds and non-reactive metal containing compounds but below the melting point of the resulting multi-metallic powder by which (1) the solvent is volatilized, (2) the reactive metal containing compounds and the non reactive metal containing compounds are decomposed to form finely divided spherical particles containing both the reactive metals and the non-reactive metals, (3) the particles are densified; and
d. separating the multi-element, finely divided, spherical, reactive metal powder containing at least one reactive metal powder and one non-reactive metal powder from the carrier gas, reaction by-products, and solvent volatilization products.

BRIEF DESCRIPTION OF THE DRAWINGS

FIG. 4 shows the scanning electron micrographs of the Ag/Cu/Co containing 65% Ag and 25% copper and 10% cobalt.
FIG. 4A is the secondary electron image and the FIG. 4B is the back scatter image.
The dark areas on the particles in FIG. 4B have higher levels of Co and the light areas have much less Co. Ag and Cu are seen throughout the particle.

DETAILED DESCRIPTION OF THE INVENTION

As used herein, the term "reactive metal" refers to a metal or mixtures of metals that react with silicon nitride to form highly conductive metal nitrides and/or silicides. Such metals include metals or mixtures thereof from titanium (Ti), zirconium (Zr), hafnium (Hf), tantalum (Ta), niobium (Nb), vanadium (V), nickel (Ni), cobalt (Co), molybdenum (Mo), manganese (Mn), and iron (Fe). Each of these reactive metals will transform silicon nitride to a highly conducting metal nitride and/or silicide by a redox reaction due to the large difference in negative free energy of formation.

The reactive metal may include small amounts of certain rare earth metals, such as lanthanum (La), cerium (Ce), dysprosium (Dy), erbium (Er), holmium (Ho), gadolinium (Ga) and the like rare earth metals such as yttrium (Y) since they form very conductive disilicides and nitrides and may participate in the transformation reaction.

Figure 1:
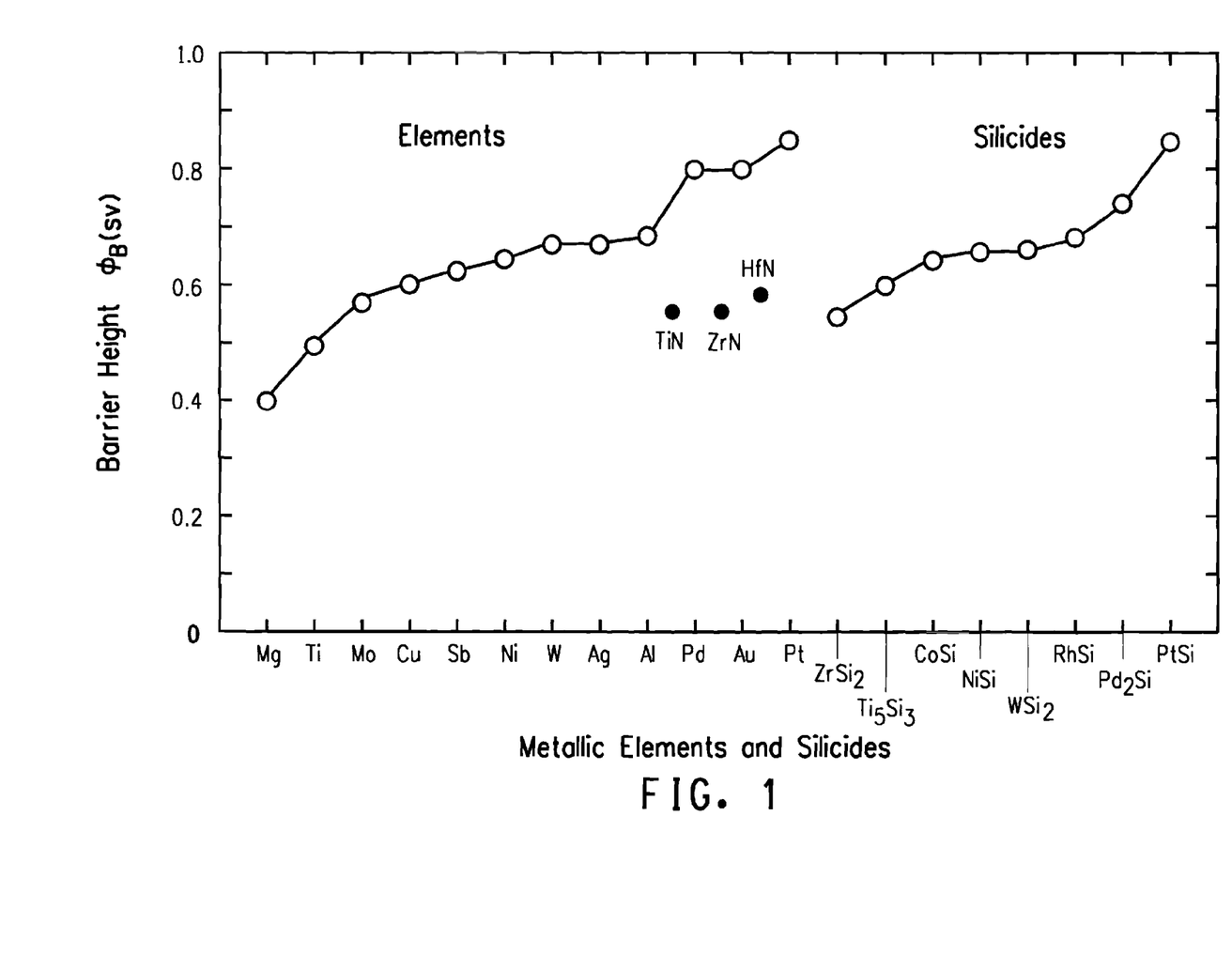
FIG. 1 shows Shottky barrier heights of various metals, nitrides, and suicides to n-type silicon.

The nitrides and silicides formed from the above reaction have Shottky barrier heights in the order of 0.5 eV (electron volt) as shown in FIG. 1 (adapted from "Barrier Heights to n-Silicon", Andrews et al., J. Vac. Sci. Tech 11, 6, 972, 1974). The Shottky barrier heights of the rare earth silicides are also very low, in the order of 0.3 eV. Reactive metal nitrides and silicides, therefore, have lower Shottky barrier height contacts to n-type silicon than for silver metal (eV of ~0.65 eV), the conventional contact for n-type silicon in silicon solar cells. An additional advantage of the reactive metal nitrides and silicides is that they are wetted very well by many molten metals.

The low Shottky barrier height contact derived from the reaction with the silicon nitride may be approximately the same thickness as the silicon nitride (70 to 100 nanometers) or may be as much as 1-2 micrometers. However, this is not sufficient to form a low resistivity current carrier to carry the current to the outside circuitry. As such, an electrode or additional metal layer of a low resistance is necessary. This may be accomplished by depositing a non-reactive metal layer over a reactive metal layer prior to or after the firing process. Another method would be to co-deposit the non-reactive metal with the reactive metal in the appropriate quantities. The co-deposition approach may comprise mixtures of metals or an alloy of the reactive metal with the non-reactive metal. The amount of reactive metal in the mixture or alloy composition is tailored to the thickness of the silicon nitride and the thickness of the deposit but will typically be 1-25%.

As used herein, the term "non-reactive metal" refers to a metal or mixture of metals that cannot transform the silicon nitride to a conducting nitride and/or silicide. Either they have a less negative free energy of formation of their silicide or nitride than that of the formation of silicon nitride or they do not form conductive nitrides.

The set of non-reactive metals may be chosen to have relatively low electrical resistivities for current carrying and melting points close to or even less than the peak firing temperature. Metal compositions may be designed with multiple elements to achieve the desired melting point by use of eutectic compositions, for example. The metal mixture may also have phosphorus (P), antimony (Sb), arsenic (As), bismuth (Bi) as they may additionally act as donor dopants to locally selectively dope the silicon under the paste during firing to further reduce its surface resistivity and improve the contact resistance. The metals may therefore, be chosen from, but not limited to, the group of metals, such as silver (Ag), tin (Sn), bismuth (Bi), lead (Pb), antimony (Sb), zinc (Zn), germanium (Ge), phosphorus (P), gold (Au), cadmium (Cd), berylium (Be), tellurium (Te). Other metals, such as those with high melting points, such as palladium (Pd), for example, may be included in small quantities to achieve other specific properties.

As used herein with respect to the solvent for the reactive metal containing compounds and the non-reactive metal containing compounds, the term "volatilizable" means that the solvent is completely converted to vapor or gas by the time the highest operating temperature is reached, whether by vaporization and/or by decomposition.

As used herein with respect to reactive metal containing compounds and non-reactive metal containing compounds, the term "thermally decomposable" means that the compound becomes fully decomposed to the metal and volatilized by-products by the time the highest operating temperature is reached.

Any soluble salt can be used in the method of the invention so long as it is inert with respect to the carrier gas used to form the aerosols. Examples include metal nitrates, chlorides, phosphates, sulfates, acetates, and the like. Specific examples include the suitable salts: $AgNO_3$, $HfCl_4$, $SnO$, $Zr(NO_3)_4$, $Zn(NO_3)_2$, $Pb(NO_3)_2$, $Mn(CH_3COO)_2$, $Mn(NO_3)_2$, $Co(NO3)2$, $Co(CH_3COO)_2$, $Ni(NO_3)_2$, $Ni(CH_3COO)_2$, and the like. The reactive metal containing compound and non-reactive metal containing compounds may be used in concentrations as low as 0.2 mole/liter and upward to just below the solubility limit of the particular salt. It is preferred not to use concentrations below 0.2 mole/liter or higher than 90% of saturation.

While it is preferred to use water-soluble metal containing salts as the source for the method of the invention, the method can nevertheless be carried out effectively with the use of other solvent-soluble compounds such as organometallic compounds dissolved in either aqueous or organic solvents.

Very small, colloidal particles of the metal containing compounds or elements may also be used provided the colloidal particles from a stable suspension.

Operating Variables: The method of the invention can be carried out under a wide variety of operating conditions as long as the following fundamental criteria are met:
 a. The concentration of the soluble reactive metal containing compound and the non-reactive metal containing compound in the aerosol must be below the saturation concentration at the feed temperature and preferably at least 10% below the saturation concentration in order to prevent precipitation of solids before removal of the liquid solvent;
 b. The concentration of droplets in the aerosol must be sufficiently low so that it is below the concentration where collisions and subsequent coalescence of the droplets results in a 10% reduction in droplet concentration;
 c. The temperature of the reactor must be below the melting point of the formed multi-element metal powder.

Though it is essential to operate under the saturation point of the soluble reactive metal containing compound and non-reactive metal containing compound, their concentration is not otherwise critical in the operation of the process. It will ordinarily be preferred to use higher concentrations to maximize the amount of particles that can be made per unit of time and to produce larger particles.

Any of the conventional apparatus for droplet generation may be used to prepare the aerosols for the invention such as nebulizers, Collison nebulizers, ultrasonic nebulizers, vibrating orifice aerosol generators, centrifugal atomizers, two-fluid atomizers, electrospray atomizers and the like. The particle size of the powder is a direct function of the droplet sizes generated. The size of the droplets in the aerosol is not critical in the practice of the method of the invention. However, as mentioned above, it is important that the number of droplets not be so great as to incur excessive coalescence which broadens the particle size distribution.

In addition, for a given aerosol generator, concentration of the solution of the reactive metal containing compound and the non-reactive metal containing compound has an effect on particle size. In particular, particle size is an approximate function of the cube root of the concentration. Therefore, the higher the metal compounds' concentration, the larger the particle size of the multi-element metal particle. If a greater change in particle size is needed, a different aerosol generator must be used.

Virtually any gas which is inert with respect to the solvent for the reactive metal containing compounds and non-reactive metal containing compounds and provides a non-oxidizing, inert atmosphere or a reducing atmosphere with respect to the formed metal compounds and metal alloys may be used as the carrier gas and the quench gas for the practice of the invention. Examples of non-oxidizing, inert gases include nitrogen gas and argon gas. Some of the reactive metals and non-reactive metals may not be fully reacted if a non-oxidizing, inert gas is used. Small amounts of metal oxide will be present. To make oxide free powders for these metals, the carrier gas needs to be a reducing gas. Examples of suitable reducing gases that can be used for the carrier gas and/or the quench gas include hydrogen, nitrogen gas containing hydrogen gas, carbon monoxide gas, and the like.

The process for making the multi-element, finely divided, spherical, metal powder containing one or more reactive metals and one or more non-reactive metals can also be done with an inert gas for the carrier gas and/or the quench gas provided a co-solvent is added to the precursor solution. Examples of suitable inert gases are nitrogen, argon, helium, and the like. Nitrogen is the preferred inert gas for the carrier gas and/or the quench gas. Suitable co-solvents are those that act as a reducing agent of the metal oxides, are vaporizable, are inert with respect to the carrier gas, are hydrophilic, and have a carbon number from 1 to 5 carbons. Examples of suitable co-solvents include alcohols, esters, ethers, ketones, and the like. These co-solvents are present in the solution in an amount from 1% to 50%, preferably 5% to 30% by weight.

The temperature range over which the method of the invention can be carried out is quite wide and ranges from the decomposition temperature of the reactive metal compounds or the non reactive metal containing compound whichever is greater, to the melting point of the formed multi-element alloy. This range varies from 300° C. to 1500° C.

The type of apparatus used to heat the aerosol is not by itself critical and either direct or indirect heating may be used. For example, tube furnaces may be used or direct heating in combustion flames may be used. It is important to not go above the melting point of the formed multi-element, finely divided, spherical, reactive metal alloy powder containing one or more reactive metals and one or more non-reactive metals reactive metal.

Upon reaching the reaction temperature and the particles are reacted and densified, they are separated from the carrier gas, reaction by-products, and solvent volatilization products and the powder collected by one or more devices such as filters, cyclones, electrostatic separators, bag filters, filter discs and the like. Upon completion of the reaction, the gas consists of the carrier gas, decomposition products of the metal compounds and solvent vapor. Thus, in the case of preparing silver, copper, manganese particles from aqueous silver nitrate, copper nitrate, and manganese nitrate using nitrogen with hydrogen as the carrier gas, the effluent gas from the method of the invention will consist of nitrogen oxides, water, nitrogen gases, and a very small amount of residual hydrogen.

The metal powders described above are mixed with an organic medium by mechanical mixing to form viscous compositions called "thick film pastes", having suitable consistency and rheology for printing. The organic medium is a fugitive material, in that it is burnt off during the initial stages of the firing process. A wide variety of inert viscous materials can be used as organic medium. The organic medium must be one in which the metal powders are dispersible with an adequate degree of stability. The rheological properties of the medium must be such that they lend good application properties to the composition, including: stable dispersion of metal powders, appropriate viscosity and thixotropy for screen printing, appropriate paste wettability of the substrate, and a good drying rate. The organic vehicle used in the thick film composition of the present invention is preferably a non-aqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 1 wt. % to 11 wt. % of the total organic composition. The thick film composition of the present invention may be adjusted to a predetermined, screen-printable viscosity with the organic medium.

The ratio of organic medium in the thick film composition to the metal components is dependent on the method of applying the paste and the kind of organic medium used, and it can vary. Usually, the dispersion will contain 70-95 wt % of metal components and 5-30 wt % of organic medium (vehicle) in order to obtain good wetting.

EXAMPLES

The following examples are provided to aid in understanding of the present invention, and are not intended to in any way limit the scope of the present invention. The details of the powder characteristics are found in Table 1. The compositions are presented in weight percent. The tap density was measured using a tap density machine manufactured by Englesmann. The surface area was measured using a Micromeritics Tristar using the BET method. The He pycnometry density was measured using a Micromeritics Accupyc 1330. X-ray diffraction was measured using a Rigaku Miniflex x-ray diffractometer. The particle size data was measured using a Micromeritics S3500. Scanning electron micrographs were made using a JEOL JSM-6700F field emission SEM.

Example 1

This example demonstrates the manufacture of a multi-element, finely divided, spherical, metal powder containing silver and copper and manganese with the ratio of 70% silver, 27% copper, and 3% manganese by weight. A precursor solution was prepared by the dissolution of silver nitrate crystals in water followed by the addition of copper nitrate and then manganese nitrate. The total amount of silver, copper, and manganese in the solution was 10 weight percent with the relative proportions so that a 70/27/3 Ag/Cu/Mn alloy will be obtained in the particles. An aerosol was then generated using nitrogen as the carrier gas and an ultrasonic generator with 9 ultrasonic transducers operating at 1.6 MHz. This aerosol was then sent through an impactor and then sent into a 3 zone furnace with the zones set at 1050° C. After exiting the furnace, the aerosol temperature is quenched with nitrogen gas and the dense, spherical shape, finely divided metal powder containing silver and copper and manganese with the ratio of 70% silver, 27% copper, and 3% manganese by weight was collected in a bag filter. Under these conditions, there was some copper oxide present as seen from x-ray diffraction analysis.

Figure 2:
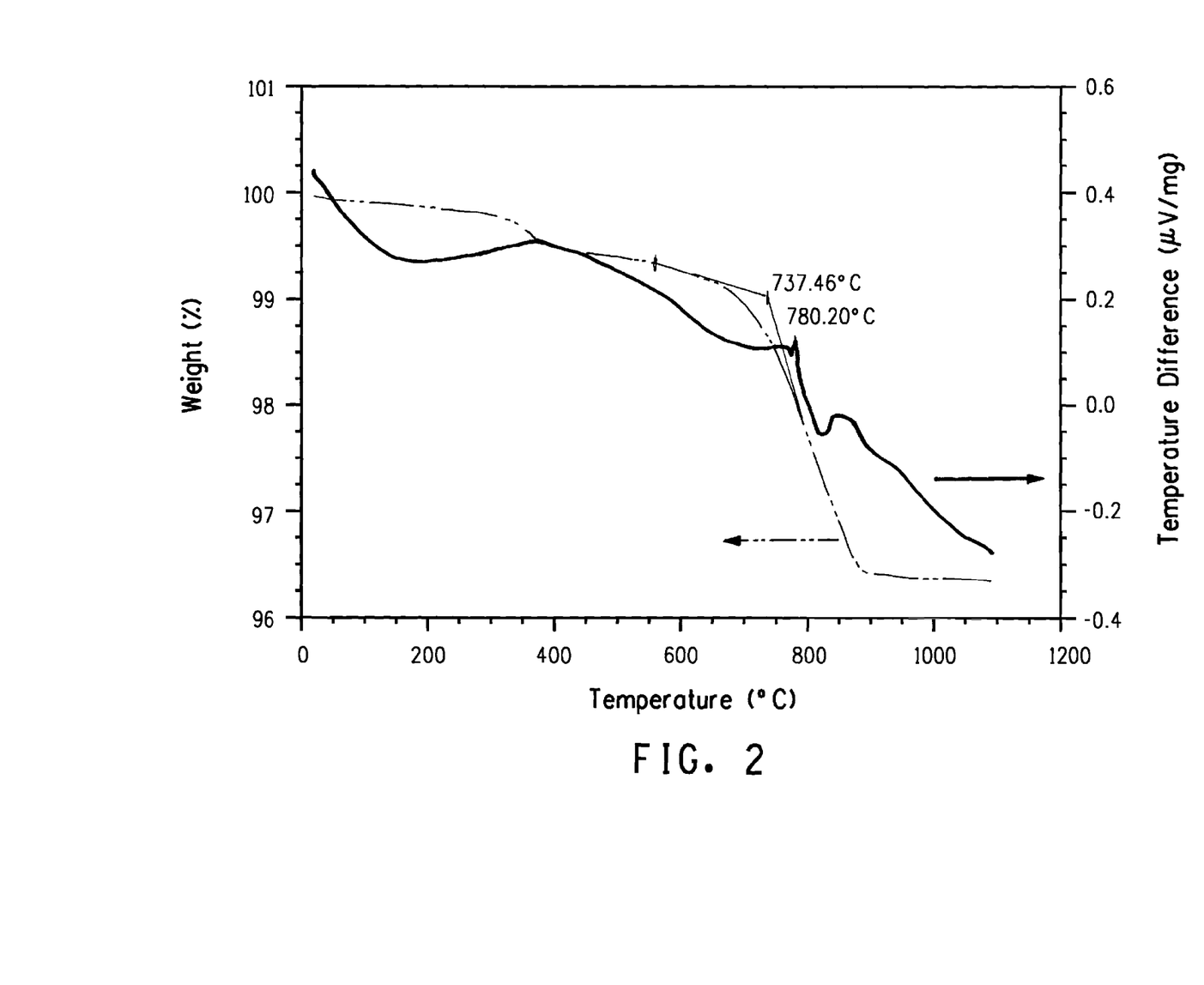
FIG. 2 shows the DTA/TGA results of a reaction between a 70 wt. % silver-30 wt. % copper-3 wt. % cobalt alloy powder and silicon nitride powder

The 70 wt. % silver-27 wt. % copper-3 wt. % manganese alloy powder was mixed with silicon nitride powder in a 1:1 volume ratio using a mortar and pestle. A simultaneous DTA/TGA was run by heating the mixture under nitrogen to approximately 1300° C. The mixture was contained in an alumina crucible during the run. The nitrogen flow rate was 100 mL/min. The heating rate was 10° C./min. FIG. 2 shows the results of the DTA/TGA run. As can be seen by the TGA a reaction started at approximately 737° C. resulting in a weight loss of a little less than 3% suggesting release of nitrogen from the silicon nitride. At around 780° C., a small exotherm and a small endotherm was observed on the DTA run suggesting a reaction took place at the exotherm point and some melting took place at the endotherm point. Additionally, an endotherm is seen at approximately 810° C. Since the silver-copper ratio would create an alloy with a melting point of 779° C., and manganese would increase the melting point somewhat, the endotherm at 810° C. suggests melting of the alloy took place Example 2

A sample of the multi-element, finely divided, alloy powder containing silver and copper and cobalt with the ratio of 70% silver, 27% copper, and 3% cobalt by weight was prepared using the same conditions as described in Example 1. Under these conditions, there was some copper oxide present as seen from x-ray diffraction analysis.

Figure 3:
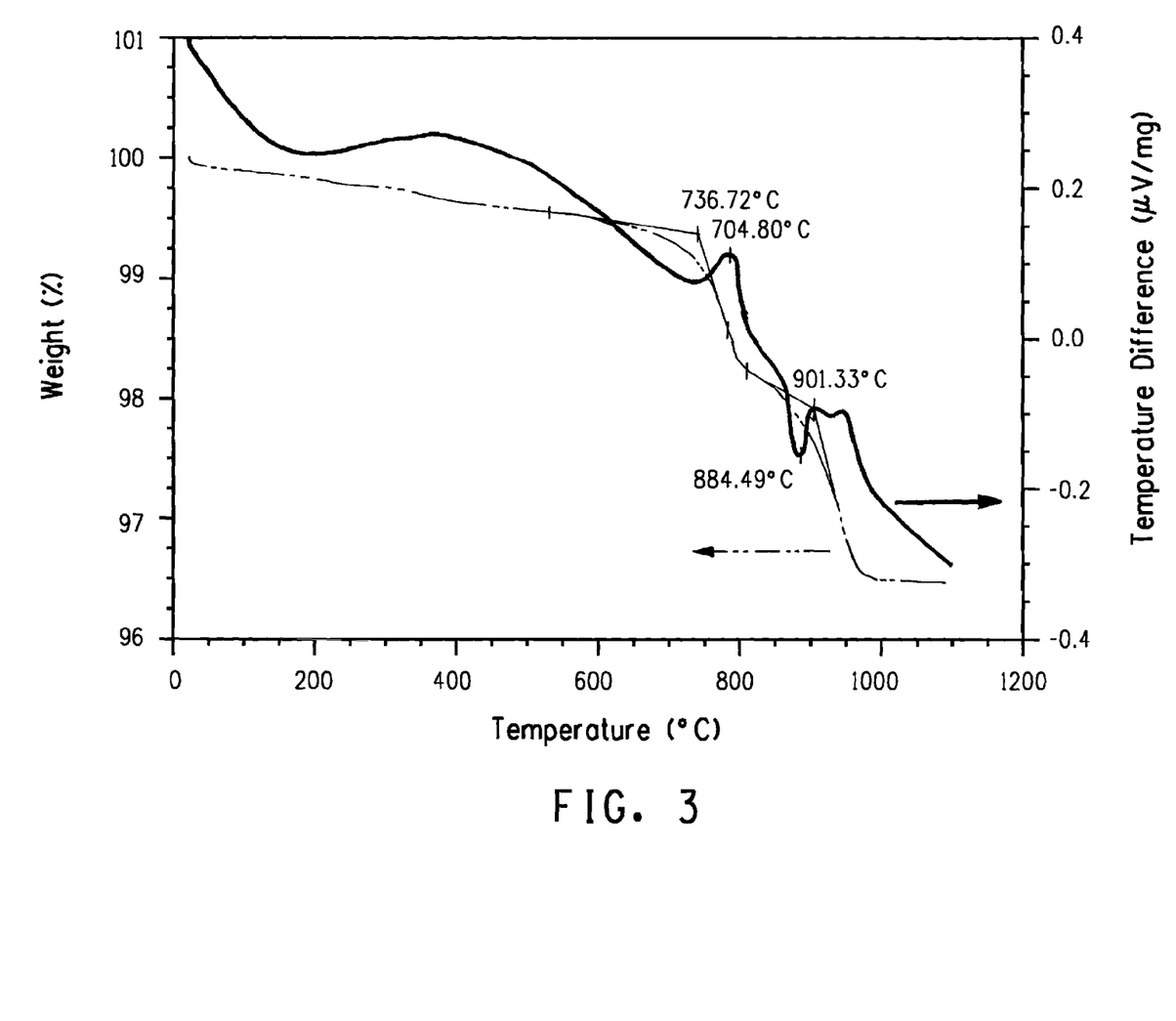
FIG. 3 shows the DTA/TGA results of a reaction between a 70 wt. % silver-30 wt. % copper-3 wt. % manganese alloy powder and silicon nitride powder

The powder mixed with silicon nitride powder in a 1:1 volume ratio using a mortar and pestle. A simultaneous DTA/TGA was run by heating the mixture under nitrogen to approximately 1300° C. The mixture was contained in an alumina crucible during the run. The nitrogen flow rate was 100 mL/min. The heating rate was 10° C./min. FIG. 3 shows the results of the DTA/TGA run. As can be seen by the TGA a reaction started at approximately 737° C. resulting in a weight loss of a little less that a 3% suggesting release of nitrogen from the silicon nitride. At a similar temperature an exotherm occurred and at the higher temperature of approximately 885° C. an endotherm was observed on the DTA run suggesting melting of the alloy took place.

Examples 1 and 2 illustrate reactions with silicon nitride powder with reactive metal powders that have significantly lower melting points than the reactive metal alone. The ratio of 70 weight % silver to 27 weight percent copper represents the eutectic composition of silver and copper. Its melting point is 779° C. Manganese melts at 1245° C. and so the addition of 3 weight % manganese to the copper silver eutectic composition raises the melting point to a little over 800° C. Cobalt melts at 1495° C. and so a 3 weight % cobalt addition to the copper silver eutectic raises the melting point to approximately 880° C. This is shown in the DTA runs. The amount of cobalt or manganese was designed to be the approximate amount needed in a low melting point alloy when used as a silicon solar cell front face metallization. As seen in the TGA runs, a reaction begins at about 737° C. for both alloys that causes a weight loss of a little less than 3%. The weight loss is representative of nitrogen evolution confirming that a relatively low melting point alloy that contains a small amount of a reactive metal content will react with silicon nitride at an attractive temperature to form a low Shottky barrier height metal silicide layer with a metal layer that can function as a current carrier.

Example 3

A sample of the multi-element, finely divided, spherical, metal powder containing silver and copper and cobalt with the ratio of 54% silver, 21% copper, and 25% cobalt by weight was prepared using the same conditions as described in Example 1. For this example, the co-solvent ethylene glycol was used. 30 weight percent ethylene glycol was added to the precursor solution. X-ray diffraction analysis confirmed that there was no metal oxide present.

Example 4

Figure 4A:
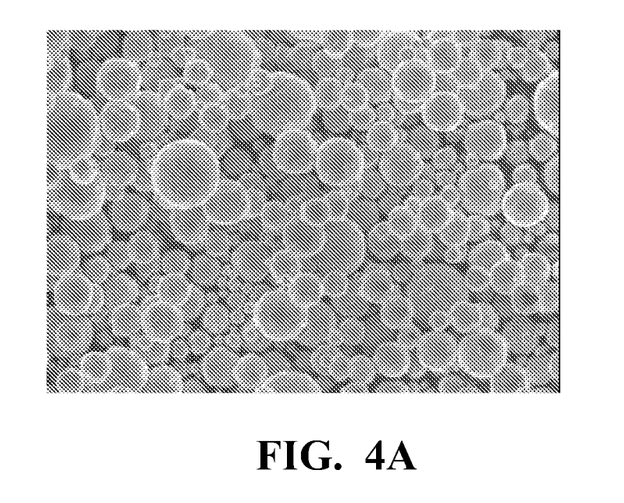
Figure 4B:
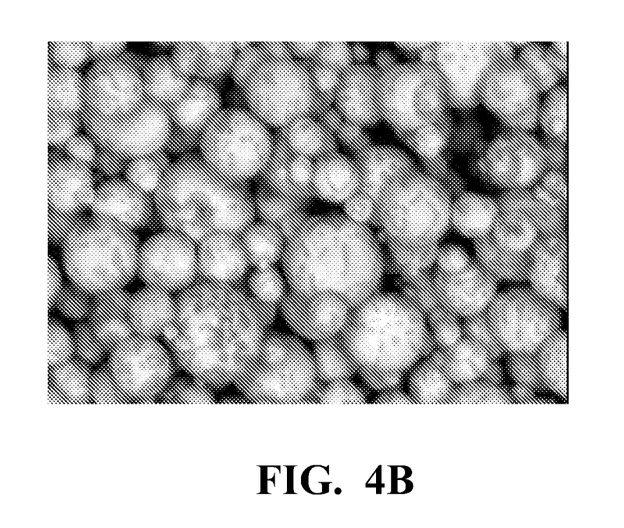

A sample of the multi-element, finely divided, spherical, metal powder containing silver and copper and cobalt with the ratio of 65% silver, 25% copper, and 10% cobalt by weight was prepared using the same conditions as described in Example 1. For this example, the co-solvent ethylene glycol was used. 30 weight percent ethylene glycol was added to the precursor solution. X-ray diffraction analysis confirmed that there was no metal oxide present. FIG. 4 shows the scanning electron micrograph of this powder. FIG. 4A is the secondary electron image showing the finely divided, spherical particles. FIG. 4B is the back scatter image where the dark areas have higher amounts of cobalt compared to the lighter areas. Silver and copper are seen throughout the particles.

What is claimed is:

1. A method for the manufacture of a multi-element, finely divided, spherical, metal powder containing one or more reactive metal powders selected from a group consisting of titanium (Ti), zirconium (Zr), hafnium (Hf), tantalum (Ta), niobium (Nb), vanadium (V), nickel (Ni), cobalt (Co), molybdenum (Mo), manganese (Mn), and iron (Fe) and one or more non-reactive metals selected from a group consisting of tin (Sn), bismuth (Bi), lead (Pb), antimony (Sb), zinc (Zn), germanium (Ge), phosphorus (P), gold (Au), cadmium (Cd), berrylium (Be), and tellurium (Te) comprising the sequential steps:
   a. forming a solution of a mixture of thermally decomposable reactive metal containing compounds and non-reactive metal containing compounds in a thermally volatilizable solvent;
   b. forming an aerosol consisting essentially of finely divided droplets of the solution from step A dispersed in a carrier gas, the droplet concentration which is below the concentration where collisions and subsequent coalescence of the droplets results in a 10% reduction in droplet concentration;
   c. heating the aerosol to an operating temperature above a decomposition temperature of the reactive metal containing compounds and non-reactive metal containing compounds but below a melting point of the resulting multi-metallic alloy by which (1) the solvent is volatilized, (2) the reactive metal containing compounds and the non reactive metal containing compounds are decomposed to form finely, divided particles, (3) the particles form an alloy and are densified; and
   d. separating the multi-element, finely divided, spherical, metal powder containing at least one reactive metal powder and one non-reactive metal powder from the carrier gas, reaction by-products, and solvent volatilization products.

2. The method of claim 1 wherein the operating temperature is between 300° C. and 1600° C.

3. The method of claim 1 where the carrier gas is an inert gas that does not react with the metals included in the multimetallic particles.

4. The method of claim 3 where the carrier gas is nitrogen.

5. The method of claim 3 where the carrier gas is a reducing gas.

TABLE 1

| Example | Material Type | % Ag | Metal 1 | % Metal 1 | Metal 2 | % Metal 2 | Carrier Gas | Co-solvent | Furnace Temperature ° C. |
|---|---|---|---|---|---|---|---|---|---|
| 1 | Ag/Cu/Mn | 70 | Cu | 27 | Mn | 3 | nitrogen | none | 1050 |
| 2 | Ag/Cu/Co | 70 | Cu | 27 | Co | 3 | nitrogen | none | 1050 |
| 3 | Ag/Cu/Co | 54 | Cu | 21 | Co | 25 | nitrogen | Ethylene glycol | 900 |
| 4 | Ag/Cu/Co | 65 | Cu | 25 | Co | 10 | nitrogen | Ethylene glycol | 1050 |

| Example | Tap Density g/ml | Surface Area m$^2$/g | He Pycnometry g/ml | d10 microns | d50 microns | d90 microns | d95 microns |
|---|---|---|---|---|---|---|---|
| 1 | 4.01 | 0.76 | 8.39 | 0.68 | 1.04 | 1.93 | 2.36 |
| 2 | 3.35 | 0.78 | 8.42 | 0.66 | 1.04 | 1.95 | 2.39 |
| 3 | 2.07 | 0.78 | 8.21 | 0.62 | 1.11 | 2.34 | 2.96 |
| 4 | 4.00 | 0.66 | 8.64 | 0.61 | 1.06 | 2.27 | 2.91 |

6. The method of claim 3 where the carrier gas is nitrogen gas with 4% hydrogen gas.

7. The method of claim 1 where a co-solvent is added in step a. to act as a reducing agent.

8. The method of claim 7 where the co-solvent reducing agent is an organic compound having 1 to 5 carbons.

9. The method of claim 8 where the co-solvent reducing agent is an alcohol.

10. The method of claim 7 where the co-solvent present in an amount of about 1% to about 50% by volume of the solution.

* * * * *